United States Patent [19]

Hart et al.

[11] Patent Number: 5,695,068
[45] Date of Patent: Dec. 9, 1997

[54] PROBE CARD SHIPPING AND HANDLING SYSTEM

[75] Inventors: Robert Allison Hart; Richard Harry Plourde, both of Gardner, Mass.

[73] Assignee: Digital Equipment Corporation, Maynard, Mass.

[21] Appl. No.: 624,678

[22] Filed: Feb. 26, 1996

Related U.S. Application Data

[63] Continuation of Ser. No. 303,996, Sep. 9, 1994, abandoned.

[51] Int. Cl.⁶ .............................. B65D 85/30; B65D 45/00
[52] U.S. Cl. .............................. 206/725; 206/486; 220/327
[58] Field of Search .............................. 206/454, 523, 206/706, 722, 724, 486, 488, 725; 220/327, 328, 241, 242

[56] References Cited

U.S. PATENT DOCUMENTS

| 3,317,072 | 5/1967 | Zavertnik et al. | 220/327 X |
|---|---|---|---|
| 3,511,990 | 5/1970 | Hauss | 206/454 X |
| 3,532,213 | 10/1970 | Schulz et al. | 206/454 X |
| 3,615,006 | 10/1971 | Freed | 206/454 |
| 3,645,758 | 2/1972 | MacManus | 220/324 X |
| 3,666,340 | 5/1972 | Albeanese, III | 220/327 X |
| 3,918,581 | 11/1975 | Scammon, Jr. et al. | 206/334 |
| 4,275,810 | 6/1981 | Waldmeier | 206/459.5 X |
| 4,511,038 | 4/1985 | Miller et al. | 206/454 |
| 4,564,880 | 1/1986 | Christ et al. | 206/724 X |
| 4,664,281 | 5/1987 | Falk et al. | 220/327 X |
| 4,706,161 | 11/1987 | Buckingham | 206/724 X |
| 4,832,612 | 5/1989 | Grabbe et al. | 206/722 X |
| 4,842,136 | 6/1989 | Nakazato et al. | 206/454 |
| 5,026,303 | 6/1991 | Matsuoka et al. | 206/724 X |
| 5,353,934 | 10/1994 | Yamauchi | 206/454 |

OTHER PUBLICATIONS

Western Electric Technical Digest No. 15, Jul. 1969.
Western Electric Technical Digest No. 30, Apr. 1973.

*Primary Examiner*—Bryon P. Gehman
*Attorney, Agent, or Firm*—David A. Dagg; Gary E. Ross; Arthur W. Fisher

[57] ABSTRACT

Disclosed is a containment system for shipping and handling probe card circuit boards. The containment system features a base member equipped with a recessed seating shelf for receiving and supporting the probe card, and a set of fasteners to hold the probe card securely in place. The base also has a second, upper-level, seating shelf to support a cover, and a second set of fasteners to hold the cover in position to seal the base and further secure the probe card in place.

7 Claims, 1 Drawing Sheet

PROBE CARD SHIPPING AND HANDLING SYSTEM

This application is a continuation of application Ser. No. 08/303,996, filed Sep. 9, 1994 now abandoned.

FIELD OF THE INVENTION

The present invention relates to shipping and handling containers, and, in particular, is directed to a shipping and handling container for a probe card used in semiconductor chip probe and test operations.

BACKGROUND OF THE INVENTION

Probe cards are specially designed printed circuit boards with associated interconnect assemblies utilized in electrical verification of integrated circuits on a semiconductor wafer. The probe card features delicate circuitry and a particularly sensitive set of fine, precisely aligned needle-like probe pins for contacting pads along the periphery of each individual die to be probed and tested.

After manufacture of the probe card printed circuit board, it will need to be transported from vendor to user, and therefore requires to be packaged in a manner sufficient to safeguard the card from damage during shipping. However, in addition to serving as protection during shipping, a containment system is needed which can be utilized during routine handling, use, service, and/or repair during the lifetime of the probe card at the site of the end-user integrated circuit manufacturer.

Current practice in the probe card manufacture and end-user communities is to ship and handle probe cards in a container consisting of a plastic base featuring a recess of a size appropriate to accept the size and shape of the probe card, and a cover which snaps into place over the base and the enclosed card. Although the probe card is set into a loosely-fitted recess, it still is free to displace (on the order of about 0.002 inch) and vibrate without any positive retention within the base. In addition, the current probe card containment system requires considerable wrestling with the container to remove the snap-on cover from the base, and, then, juggling of probe card and base to remove the product from the container's fitted recess. This extended handling only exposes the delicate probe card to further risk of damage.

SUMMARY OF THE INVENTION

Now, according to the present invention, an improved containment system has been developed wherein a recessed container base is provided, such that a probe card, test board, or similar such sensitive product, is positioned in a fitted recess and held by fasteners independent of any cover retention means. Accordingly, a probe card, or similar such product, is secured with the base and yet the protected card still can be readily available for visual inspection, design review, and/or product repair and rework, and the like. For other handling, shipment, storage, and the like, a cover can be set in place on a second level provided in the container base, on a seating shelf above the probe card, and a second set of fasteners is provided to hold the cover in place to effectively seal the container and secure the probe card in place.

BRIEF DESCRIPTION OF THE DRAWINGS

For a further understanding of the nature of the present invention, as well as other features and advantages thereof, reference should be made to the following description taken in conjunction with the accompanying drawings wherein.

DETAILED DESCRIPTION OF PREFERRED EMBODIMENTS

Figure 1:
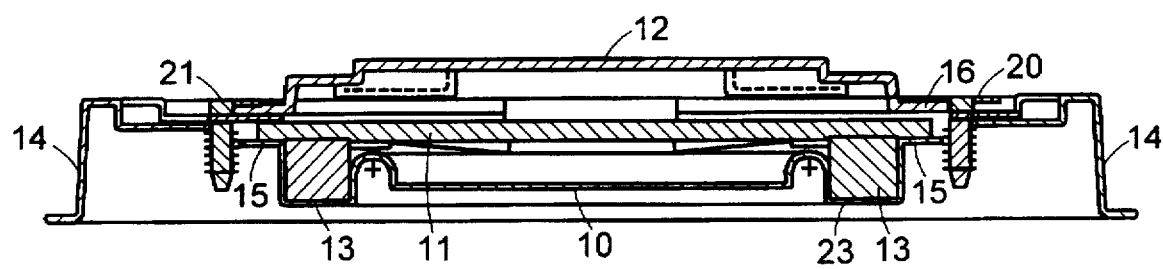
FIG. 1 is a cross-sectional side view of one embodiment, of a containment system according to the present invention.

Referring to FIG. 1, a containment system is shown wherein a base member 10 is provided with a recessed seating shelf 15 to receive and support probe card 11. Cover 12 fits over the base and rests on a second, upper level recessed seating shelf 16 to enclose the probe card within the base. Probe cards typically feature a generally flat circular shape, and, accordingly, the containment system shown is of a circular, disc-like shape to accommodate a typical circular enclosed probe card. Preferably, the base member provides electrostatic dissipative protection for the enclosed probe card, and, typically is molded from conductive plastic material such as conductive ABS, PVC, Regalite, and the like.

In order to offer cushioning to provide additional protection from mechanical shock during handling or transport, in a preferred embodiment, the base includes a recess 23 to house a concentric compliant cushion member 13. This cushion typically can be made of material such as an electrostatic dissipative foam.

Another alternative feature of the embodiment as shown is the provision of a circumferential stabilizer 14 which is set around the circumference of the base and extends below the plane of the bottom of the lowermost portion of the base, so as to suspend the interior portion of the base from a surface on which the base may be resting. In this manner, the circumferential stabilizer serves as a suspension system to avoid shock to the base and precludes the containment system from inadvertently tipping or rolling over during handling.

Figure 2:
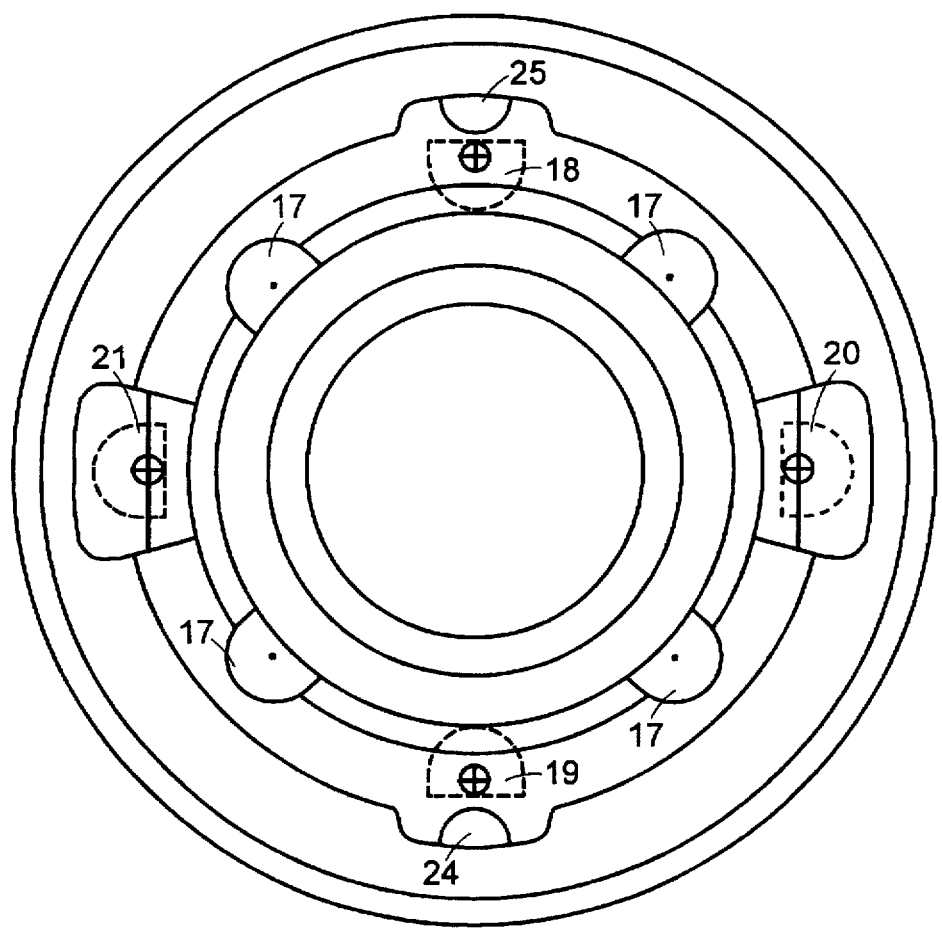
FIG. 2 is an overhead view of one embodiment of the present invention.

As illustrated in FIG. 2, the base is further equipped with four thumb or finger slots to facilitate direct removal of the probe card from the base, without having to physically invert the base to remove the probe card by actually allowing it to fall out. The slots accommodate the tips of the fingers or thumbs positively to grasp the edge of the probe card for secure controlled removal.

A critical feature of the subject containment system is the provision of fasteners to secure the probe card to the base and the cover to the base in independent operations. As shown in FIG. 2, one set of fasteners 18 and 19 consists of mechanical single-tiered latches which are selectively pivotable to be in an open position, with the flat side facing the inserted probe card, but not extending over its edge, or, in a closed portion, as shown in FIG. 2, with the rounded portion of the fastener extending over the probe card edge to hold it in place seated on the lower level, recessed seating shelf. A second set of fasteners 20 and 21 also is positioned to be selectively pivotable into a closed or an open position, as respectively illustrated by fasteners 21 and 20 in FIG. 1. In a preferred embodiment, the second set of fasteners, 20 and 21, are mechanical, two-tiered latches designed in parallel. Accordingly, when the fastener is pivoted into locking position, the upper tier latch locks the cover in place, and the lower tier latch serves to further secure the probe card in place.

As a feature to ensure that the probe card is locked securely within the base before the cover is set in place over the base and the enclosed probe card, the cover can be provided with protruding elements 24 and 25 (shown in FIG. 2) which prevent the cover from settling in position over the base, unless fasteners 18 and 19 are pivoted into locking position with the flat side of the fastener facing the periphery of the base, in which position the protruding elements do not encounter the fasteners.

While the invention has been described with reference to specific embodiments thereof, it is intended that all matter contained in the above description or shown in the accompanying drawings be interpreted as illustrative and not limiting in nature. For example, the containment system may readily be adapted for a variety of applicable products other than probe card printed circuit boards. In addition, although a single product containment system is specifically shown and described, multiple recess levels may be provided to accommodate a variety of product shapes or sizes, or multiple recesses may accommodate containment of multiple products within a single containment system. Various other modifications of the disclosed embodiments, as well as other embodiments of the invention, will be apparent to those skilled in the art upon reference to this description, or may be made without departing from the spirit and scope of the invention defined in the appended claims.

We claim:

1. A containment system for a product having peripheral edges, comprising:

a cover member having peripheral edges;

a base member including a recess for receiving and supporting the peripheral edges of the product, and, an upper-level seating shelf for receiving and supporting said peripheral edges of said cover member, said base member provided with a first set of fasteners for securing the peripheral edges of the product within said recess, each of said first set of fasteners moveable between a first position and a second position with respect to said base member, each of said first set of fasteners securing the peripheral edges of the product within said recess when in said first position, and a second set of fasteners for securing said peripheral edges of said cover member supported by the upper-level seating shelf, and said cover member including protruding elements for preventing said cover member from settling into position on said upper-level seating shelf unless each of said first set of fasteners are in said first position.

2. A probe card containment system for a probe card having peripheral edges, comprising:

a cover member having peripheral edges;

a base member including a first, recessed, seating shelf for receiving and supporting the peripheral edges of the probe card and a second, upper-level seating shelf for receiving and supporting said peripheral edges of said cover member, said base member provided with a first set of fasteners for securing the peripheral edges of the probe board on said first seating shelf within said base member, each of said first set of fasteners moveable between a first position and a second position with respect to said base member, each of said first set of fasteners securing the probe card on said first seating shelf when in said first position, and a second set of fasteners arranged to selectively secure said peripheral edges of said cover member supported by said second, upper-level, seating shelf; and said cover member including protruding elements for preventing said cover member from settling into position on said upper-level seating shelf unless each of said first set of fasteners are in said first position.

3. The probe card containment system of claim 2 wherein the first set of fasteners are pivotable, mechanical latches and the second set of fasteners are pivotable, two-tiered, mechanical fastener devices having parallel latches for securing the probe card supported on the first, recessed seating shelf, as well as securing the cover member supported on the upper level, seating shelf.

4. The probe card containment system of claim 2 wherein the base member includes a compliant cushion which is fitted into a recess within the base member for contact with the probe card supported on the recessed seating shelf.

5. The probe card containment system of claim 2 wherein the base member is equipped with a peripheral stabilizer member extending from the base member to below the plane of the lowermost portion of the base member, to suspend and stabilize the base member.

6. The probe card containment system of claim 2 wherein the base member is fitted with finger slots around the periphery of the first recessed seating shelf, to accommodate grasping the peripheral edges of the probe card.

7. The probe card containment system of claim 2 wherein said base member is equipped with multiple, recessed seating shelves for supporting and securing multiple probe cards within the base member.

* * * * *